(12) United States Patent
Potter et al.

(10) Patent No.: US 7,053,664 B2
(45) Date of Patent: May 30, 2006

(54) NULL VALUE PROPAGATION FOR FAST14 LOGIC

(75) Inventors: Terence M. Potter, Austin, TX (US); James S. Blomgren, Austin, TX (US)

(73) Assignee: Intrinsity, Inc., Austin, TX (US)

( * ) Notice: Subject to any disclaimer, the term of this patent is extended or adjusted under 35 U.S.C. 154(b) by 629 days.

(21) Appl. No.: 10/300,289

(22) Filed: Nov. 20, 2002

(65) Prior Publication Data

US 2004/0006753 A1  Jan. 8, 2004

Related U.S. Application Data

(63) Continuation of application No. 10/187,879, filed on Jul. 2, 2002, now Pat. No. 6,956,406.

(60) Provisional application No. 60/302,590, filed on Jul. 2, 2001.

(51) Int. Cl.
*H03K 19/20* (2006.01)

(52) U.S. Cl. ......................................... 326/121; 326/93

(58) Field of Classification Search ................ 326/112, 326/119, 121, 93
See application file for complete search history.

(56) References Cited

U.S. PATENT DOCUMENTS

| | | | |
|---|---|---|---|
| 5,543,731 A | 8/1996 | Sigal et al. ..................... 326/40 |
| 5,576,651 A | 11/1996 | Phillips ....................... 327/202 |
| 5,841,712 A | 11/1998 | Wendell et al. ............. 365/200 |
| 5,917,355 A | 6/1999 | Klass .......................... 327/208 |
| 5,920,218 A | 7/1999 | Klass et al. .................. 327/200 |
| 6,043,696 A | 3/2000 | Klass et al. .................. 327/211 |
| 6,066,965 A | 5/2000 | Blomgren et al. ............ 326/95 |
| 6,069,497 A | 5/2000 | Blomgren et al. .......... 326/105 |
| 6,104,642 A | 8/2000 | Blomgren et al. |
| 6,118,304 A | 9/2000 | Potter et al. ................... 326/93 |
| 6,118,716 A | 9/2000 | Horne et al. |
| 6,121,807 A | 9/2000 | Klass et al. .................. 327/218 |
| 6,201,415 B1 | 3/2001 | Manglore ..................... 326/98 |
| 6,202,194 B1 | 3/2001 | Seningen et al. ............. 716/10 |
| 6,219,686 B1 | 4/2001 | Petro et al. ................. 708/670 |
| 6,246,266 B1 | 6/2001 | Bosshart ....................... 326/98 |
| 6,269,387 B1 | 7/2001 | Petro et al. ................. 708/710 |
| 6,275,838 B1 | 8/2001 | Blomgren et al. |
| 6,275,841 B1 | 8/2001 | Potter et al. |
| 6,289,497 B1 * | 9/2001 | Leight et al. ................. 716/17 |
| 6,301,600 B1 | 10/2001 | Petro et al. |

(Continued)

OTHER PUBLICATIONS

Kukimoto, Yuji and Jang, Jae-Young, "VIS CTL Syntax" Manual dated Feb. 27, 1997, The VIS Group, Univ. of CA.

(Continued)

*Primary Examiner*—Don Le
(74) *Attorney, Agent, or Firm*—Matthew J Booth & Associates PLLC; Matthew J Booth

(57) ABSTRACT

Power consumption in NDL designs utilizing FAST14 technology can be controlled via the introduction and propagation of null value 1-of-N signals in selected areas of the logic. A shared logic tree circuit, which might perform an arithmetic function or a multiplexing function, evaluates a 1-of-N input logic signal and produces a 1-of-N output logic signal having a null value if the input has a null value. A null value signal is defined as a valid multiwire 1-of-N signal used in NDL logic having N wires where N is greater than 2, where no one of the N wires of the 1-of-N signal is asserted when the NDL gate evaluates.

8 Claims, 10 Drawing Sheets

U.S. PATENT DOCUMENTS

| | | | |
|---|---|---|---|
| 6,324,239 B1 * | 11/2001 | Potter et al. | 377/64 |
| 6,367,065 B1 * | 4/2002 | Leight et al. | 716/18 |
| 6,437,602 B1 | 8/2002 | Friend et al. | 326/93 |
| 6,469,953 B1 | 10/2002 | Hong | 365/230.08 |
| 6,529,045 B1 | 3/2003 | Ye et al. | 326/95 |

OTHER PUBLICATIONS

U.S. Appl. "Static Transmission of FAST14 Logic 1-of-N Signals" Inventors: Potter, et al., U.S. Appl. No. 10/186,770, filed on Jul. 1, 2002.

* cited by examiner

NULL VALUE PROPAGATION FOR FAST14 LOGIC

CROSS REFERENCE TO RELATED APPLICATIONS

This application claims the benefits of the earlier filed U.S. Provisional Application Ser. No. 60/302,590, filed 02 Jul. 2001, which is incorporated by reference for all purposes into this specification.

Additionally, this application is a continuation of U.S. patent application Ser. No. 10/187,879, filed 02 Jul. 2002 is now U.S. Pat No. 6,956,406, which is incorporated by reference for all purposes into this specification.

BACKGROUND OF THE INVENTION

1. Field of the Invention

The present invention relates to power management in dynamic logic. More specifically, the present invention relates to a technique that introduces and propagates a null value signal into and through certain areas of NDL dynamic logic to reduce the overall power consumption of the logic, without impacting the timing or performance of the design.

2. Description of the Related Art

Intrinsity Inc. (f/k/a EVSX Inc.), the assignee of this application, has developed a new dynamic logic design style and an associated family of semiconductor devices, originally designated as N-NARY logic, and now known as NDL logic implemented in FAST14 technology. N-NARY dynamic logic circuits (denoted as "NDL gates"), comprise a logic tree circuit that couples to one or more input logic paths and one or more output logic paths. The logic tree circuit is a single, shared bgic tree comprising transistors organized into multiple evaluation paths that evaluate the function of the logic circuit (e.g., an AND/NAND function, an OR/NOR function, or an XOR/Equivalence function, and the like). The logic tree is precharged using a precharge circuit and evaluates using an evaluate circuit, both of which are controlled by a clock signal.

The input and output logic paths in a NDL gate, and indeed, the datapath between successive NDL gates typically do not carry binary signals. Instead. NDL logic uses a new signal structure, a "1-of-N signal", which is a multi-wire 1-hot signal that conveys a signal value using a specifically defined encoding scheme. NDL logic and 1-of-N signals can be used to build adders, shifters, multipliers, boolean units, RAM devices, and even entire datapaths. Intrinsity's NDL logic and 1-of-N signal technology is illustrated and described in U.S. Pat. No. 6,069,497, entitled "Method and Apparatus for a N-NARY Logic Circuit Using 1 of N Signals" and U.S. Pat. No. 6,066,965, entitled "Method and Apparatus for a N-NARY Logic Circuit Using 1 of 4 Signals" (collectively, "the NDL Patents"), both of which are incorporated by reference for all purposes into this specification. The NDL Patents also disclose NDL implementations of basic logic building blocks such as boolean units and multiplexers. NDL implementations of additional commonly used logic elements (e.g., adders, shifters, multipliers, registers, and RAM devices) are described in U.S. Pat. Nos. 6,301,600; 6,269,387; 6,324,239; 6,275,841; 6,275,838, 6,104,642; and 6,118,716; all of which are incorporated by reference for all purposes into this specification. FAST14 technology uses NDL gates, high-speed static logic storage and transmission techniques, and a novel timing and logic synchronization approach comprising multiple clock domains with overlapping phases, as described in U.S. Pat. No. 6,118,304, entitled "Method and Apparatus for Logic Synchronization" (hereinafter, "the Logic Synchronization Patent"), which is also incorporated by reference for all purposes into this specification.

Because NDL logic is dynamic logic, it is extremely fast but can have some of the power consumption issues commonly associated with dynamic logic. Like traditional dynamic logic, NDL gates require a frequent refresh to hold a logic state, and constantly switching transistors on and off to precharge and then evaluate dynamic logic gates can consume an enormous amount of power. Intrinsity has thus developed several approaches that bgic designers developing designs using FAST14 technology can use to eliminate unnecessary power consumption, including embedding static logic into NDL gates and statically transmitting data across FAST14 logic, both disclosed in U.S. patent application Ser. Nos. 10/187,879 and 10/186,770, respectively. The present invention is yet another method that designers can use to avoid unnecessary power consumption in certain areas and certain versions of NDL logic in FAST14 technology, as described further herein.

The NDL Patents describe the encoding scheme used in multi-wire 1-of-N signals, where the 1-of-N signal's value is encoded according to which specific wire of the multi-wire bundle is asserted. As described in the NDL Patents, the NDL logic family supports a variety of signal encodings. All signals are of the 1-of-N form where N is any integer greater than one. Table 1 demonstrates, using a 1-of-4 signal as an example, the correlation between the 1-of-N signal value (in Table 1, decimal values 0–3) and which of the N wires in the bundle that comprises the 1-of-N signal (wires A[3] through A[0]) is asserted.

TABLE 1

| (1-of-4) Signal A Decimal Value | Binary dit | (1-of-4) Signal A wire asserted | | | |
|---|---|---|---|---|---|
| A | value | A[3] | A[2] | A[1] | A[0] |
| 0 | 00 | 0 | 0 | 0 | 1 |
| 1 | 01 | 0 | 0 | 1 | 0 |
| 2 | 10 | 0 | 1 | 0 | 0 |
| 3 | 11 | 1 | 0 | 0 | 0 |

As shown in Table 1, and described further in the NDL Patents, a valid 1-of-N signal will never have more than one wire asserted. Similarly, NDL logic requires that a high voltage be asserted on exactly one wire for all values, even 0. Consequently, 1-of-N signals are also referred to as "1-hot" signals, meaning that one and only one wire of the multiwire 1-of-N signal will be asserted for the signal to have a decimal or dit value. The NDL Patents designate a 1-of-N signal with no wires asserted (all wires at a low voltage) as meaning that a value is "unavailable" for the signal. A 1-of-N signal with no wires asserted, meaning that it has no value or an "unavailable" value, is now designated as a "null value" signal, meaning that it is considered a valid signal, but simply has no value. Note that a signal having a null value is not the same as a signal having a logic value of "0", which occurs when, as shown in Table 1 above, wire A[0] is asserted.

A FAST14 technology based design can be designed to either support and/or actively use null value signals, or it can be designed such that null value signals are considered invalid. In versions that support the use of valid null value signals, the present invention, which includes the introduction and propagation of null value signals through selected NDL gates, can be highly useful to control the overall power consumption of a FAST14 based design, because it enables designers to essentially "power down" unused sections of logic without affecting the docking or synchronization of the logic. Using null value signals in areas of the design that are unused eliminates the need to constantly refresh dynamic data in those areas, where the data would be unused anyway.

SUMMARY OF THE INVENTION

The present invention is a method and apparatus that uses an NDL logic gate to propagate a null value 1-of-N signal to reduce power consumption in certain areas of FAST14 based logic. The present invention includes a 1-of-N input logic signal and a shared logic tree circuit that evaluates the 1-of-N input logic signal and produces a 1-of-N output logic signal that is a null value signal if the 1-of-N input logic signal is a null value signal. A null value signal is defined as a 1-of-N signal, which is a multiwire signal used in NDL logic that has N wires where N is greater than 2, where no one of the N wires of the 1-of-N signal is asserted when the NDL logic gate evaluates. The shared logic tree circuit may be a circuit that performs an arithmetic function that manipulates the input 1-of-N logic signal or combines the 1-of-N input logic signal with another input signal to produce an output signal, such as an adder or a Boolean logic function, or it may perform a multiplexing function that selects one or more input 1-of-N input logic signals to produce the 1-of-N output logic signal. In either case, practitioners of the present invention force the 1-of-N output logic signal to be a null value signal by forcing the 1-of-N input logic signal to be a null value signal while the logic tree circuit evaluates. If the 1-of-N output logic signal comprises an input signal to another NDL gate, then the null value signal will also propagate through that gate.

DESCRIPTION OF THE DRAWINGS

To further aid in understanding the invention, the attached drawings help illustrate specific features of the invention and the following is a brief description of the attached drawings.

DETAILED DESCRIPTION OF THE INVENTION

The present invention is a method and apparatus for an NDL logic circuit that uses and propagates null value 1-of-N signals. This disclosure describes numerous specific details that include specific encodings, structures, circuits, and logic functions in order to provide a thorough understanding of the present invention. For example, the present invention describes circuits with AND/NAND, OR/NOR, and XOR/Equivalence logic functions, along with decoders, adders, shifters, and multiplexers. One skilled in the art will appreciate that one may practice the present invention without these specific details, and that one may practice the present invention using other logic functions and circuits that may not be specifically described. Additionally, this disclosure does not describe some well-known structures such as transistors, FETs, domino circuits, and dynamic circuits in detail in order not to obscure the present invention. The descriptors "N-NARY", "FAST14" and "NDL" are trademarks owned by Intrinsity Inc. that describe and relate to the new dynamic logic family and associated timing technology disclosed in the patents and other documents referenced herein. "N-NARY logic" and "NDL logic" mean the same thing and are used interchangeably throughout this specification. "NDL circuits" and "NDL gates" are 1-of-N dynamic logic circuits implemented in the FAST14 logic technology. The phrase "FAST14 technology" refers to logic design and implementation approaches that utilize NDL gates, high-speed static storage and transmission logic, and timing and logic synchronization techniques developed by Intrinsity Inc.

As described above, the NDL logic family supports a variety of signal encodings, including the 1-of-4 encoding shown in Table 1 above. In 1-of-4 encoding, four wires are used to indicate one of four possible values. All signals in NDL logic, including 1-of-4, are of the 1-of-N form where N is any integer greater than one. A 1-of-4 signal requires four wires to encode four numerical values (0–3 inclusive), or the equivalent of two bits of information. More than one wire will never be asserted for a 1-of-N signal. Similarly, for a 1-of-N signal to transmit a numerical value (including 0), a high voltage must be asserted on one of the wires of the signal. A 1-of-N signal that does not have a high voltage asserted on one of its wires does not assert a numerical value; it is designated as a "null value" signal. As described in more detail below, null value signals can be highly useful in versions of NDL logic that, by definition and design convention, recognize null value signals as valid signals.

Figure 1:
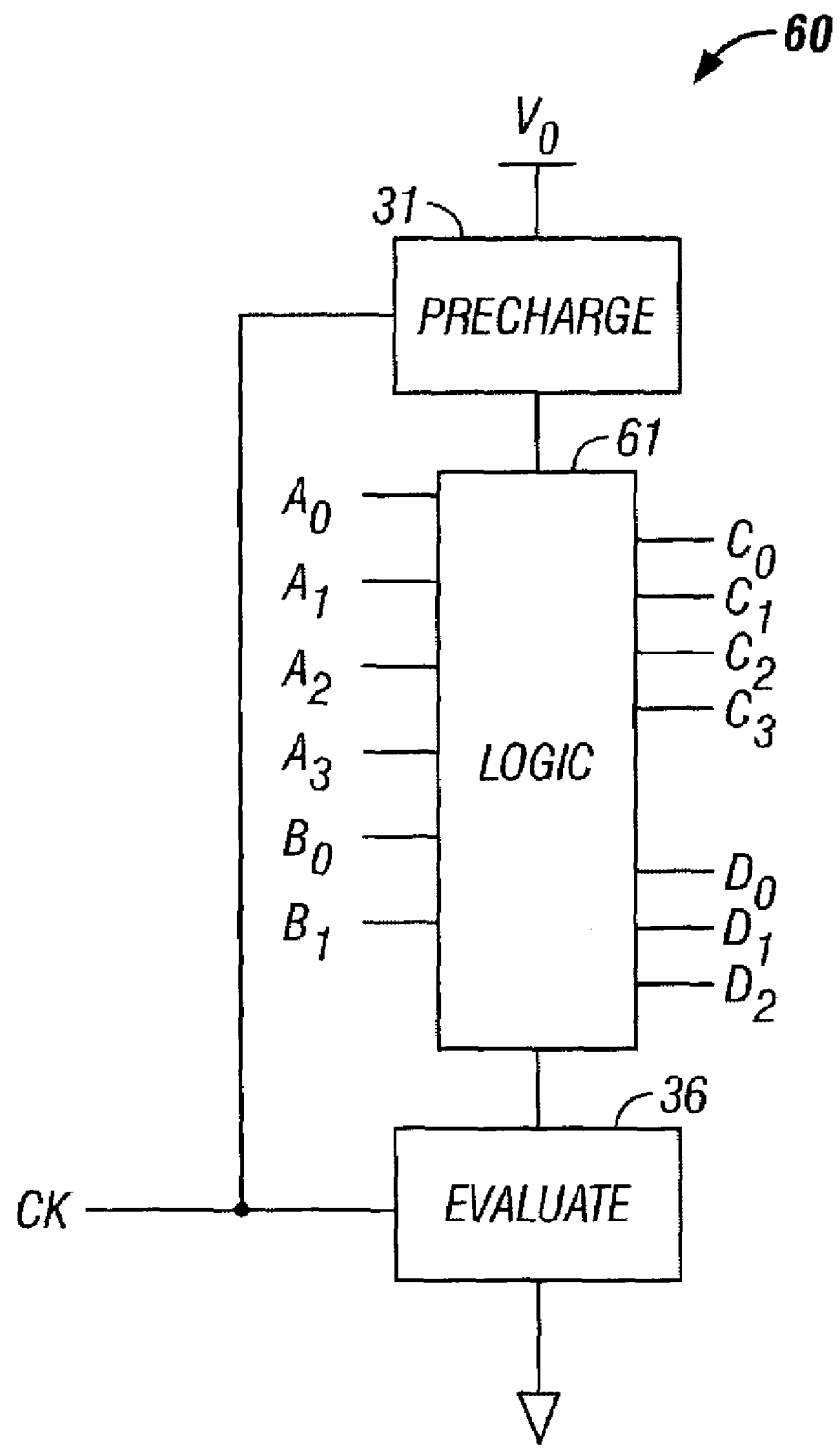
FIG. 1 illustrates an NDL gate 60 having 1-of-N input signals A and B and 1-of-N output signals C and D.

Any one NDL gate may comprise multiple inputs and/or outputs. In such a case, a variety of different NDL encodings may be employed. For instance, consider a gate that comprises two inputs and two outputs, where the inputs are a 1-of-4 signal A (having input wires $A_0$ through $A_3$) and a 1-of-2 signal B (having input wires $B_0$ and $B_1$) and the outputs comprise a 1-of-4 signal C (wires $C_0$–$C_3$) and a 1-of-3 signal D (wires $D_0$–$D_2$). Each of these input and output signals is a 1-of-N signal where N equals 4 for 1-of-N signal A and B, 2 for 1-of-N signal C, and 3 for 1-of-N signal D. FIG. 1 illustrates an NDL gate 60 having such inputs and outputs. In gate 60, input signal A comprises four wires capable of encoding four values, thus representing 2 bits (one dit) of data. Input signal B comprises two wires capable of encoding two numerical values, thus representing one bit of data. Output signal C comprises four wires capable of carrying one bit of data, and output signal D comprises three wires capable of carrying three different values. Referring to FIG. 1, each NDL gate 60 comprises a logic tree circuit 61, a precharge circuit 31, and an evaluate circuit 36. The logic tree circuit 61 comprises one or more FETs with the preferred embodiment of the logic tree circuit comprising N-channel FETs, which performs a logic function on the two 1-of-N input signals A and B that could comprise a variety of functions, for example, the Boolean logic functions AND/NAND and OR/NOR, or the more complex arithmetic function such as an add/subtract/carry-propagate function. A precharge circuit 31 couples to the logic tree circuit 61 and precharges the dynamic logic of the logic tree circuit. The precharge circuit 31 comprises one or more FETs with the preferred embodiment of the circuit comprising P-channel FETs. Each evaluation path of the logic tree circuit has its own precharge P-FET. Coupled to the precharge circuit 31 is the clock signal CK. A low clock signal on CK will cause the FETs in the logic tree circuit 61 to charge when using P-channel FETs in the precharge tree circuit (the "precharge phase" of the NDL gate).

An evaluate circuit 36 couples to the logic tree circuit and controls the evaluation of the logic tree circuit. The evaluate circuit 36 comprises one or more FETs with the preferred embodiment of the circuit comprising a single N-channel FET. Coupled to the evaluate circuit 36 is the clock signal CK. A high clock signal on CK will cause the FETs in the logic tree circuit 61 to evaluate when using N-channel FETs in the evaluate circuit (the "evaluate phase" of the NDL gate).

Figure 2:
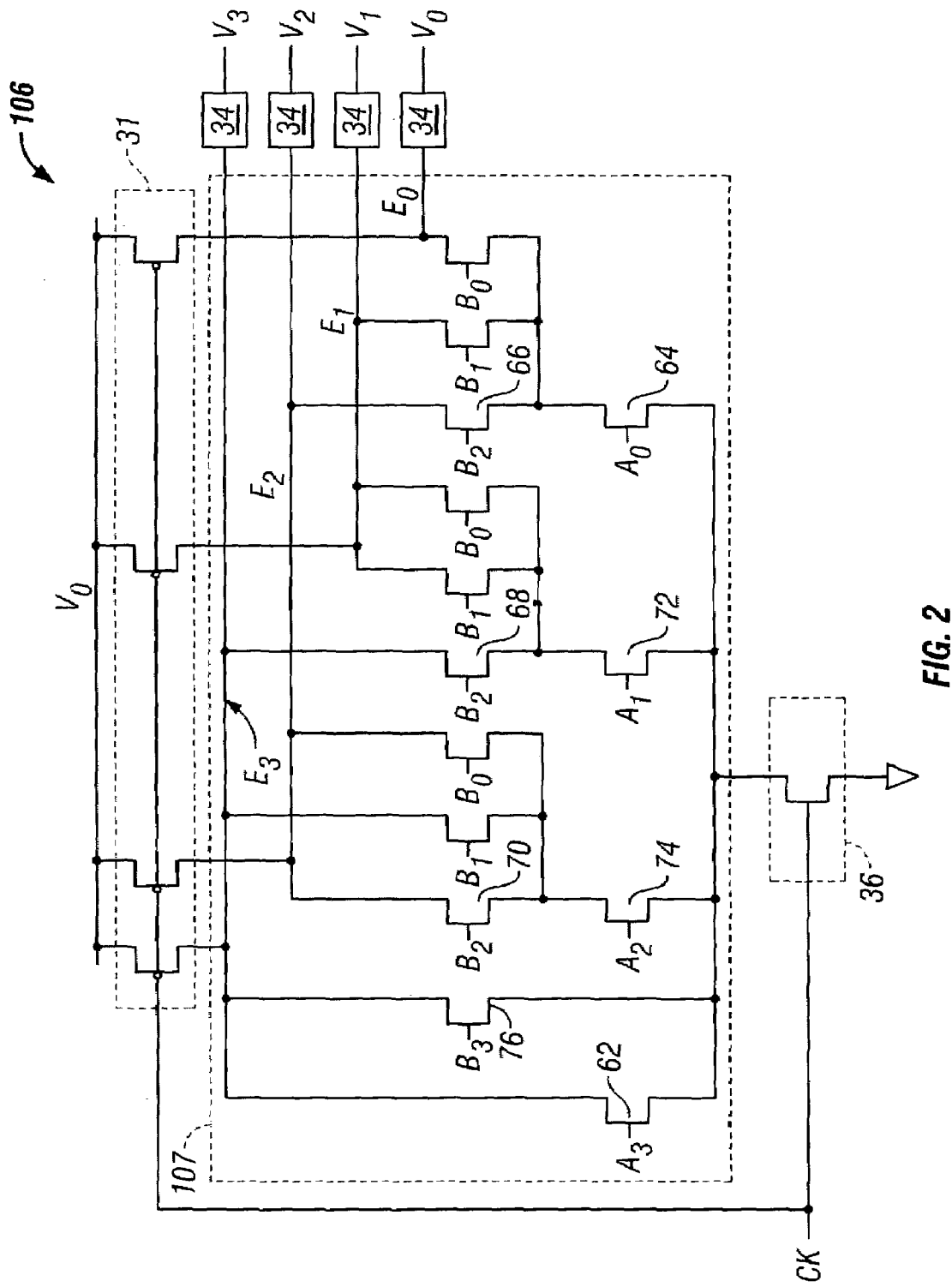
FIG. 2 is a diagram of an NDL OR/NOR gate 106 having two 1-of-4 inputs A and B, comprising input wires $A_0$–$A_3$ and $B_0$–$B_3$, respectively.

FIG. 2 is a diagram of an NDL OR/NOR gate 106 having two 1-of-4 inputs A and B, comprising input wires $A_0$–$A_3$ and $B_0$–$B_3$, respectively. Those skilled in the art will appreciate that one function is the inverse of the other. Each input wire gates one or more NFETs in the logic tree circuit 107. The OR/NOR gate 106 has an output 1-of-4 signal V, comprising output wires $V_0$–$V_3$. As shown in FIG. 2, OR/NOR gate 106 includes a precharge circuit 31 that comprises four PFETs, each one coupled to an evaluation node $E_0$–$E_3$ of the logic tree circuit 107. CR/NOR gate 106 also has an evaluate circuit 36 comprised of one evaluate NFET that conducts, providing a path to ground, when the clock signal CK is high.

Those skilled in the art and familiar with dynamic logic, NDL logic, and with FAST14 technology understand that during the precharge phase of the OR/NOR gate 106, the PFETs of the precharge circuit 31 conduct and pull the evaluate nodes $E_0$–$E_3$ to a high voltage. During the evaluate phase, the evaluate transistor 36 conducts. If an appropriate combination of input wires $A_0$–$A_4$ and $B_0$–$B_4$ is high, causing one of the transistor combinations between the evaluate transistor and an evaluate node to conduct, the high voltage on that evaluate node will discharge through the evaluation path, causing one evaluate node to be low and the other evaluate nodes to remain high. For example, if input wires $A_0$ and $B_2$ are high, then transistors 64, 66, 68, and 70 will conduct. Evaluate node $E_2$ will discharge through transistors 66, 64, and the evaluate transistor 36. Although transistors 68 and 70 are also conducting, transistors 72 and 74 are not, so evaluate node $E_3$ will not discharge. In this gate, if input wire $A_3$ is high, then transistor 62 conducts and evaluate node $E_3$ will discharge, regardless of which input wire of input signal A is high. Similarly, if input wire $A_3$ is high, then transistor 76 conducts and evaluate node $E_3$ will discharge, regardless of which input wire of input signal B is high. Ordinarily, logic tree circuits used in NDL logic are constructed such that during an evaluation cycle, there is only one evaluation path and only one evaluate node is allowed to discharge. Some simpler circuits, like the circuit shown in FIG. 2, allow a single evaluate node to discharge through parallel paths, as is the case for evaluate node $E_3$ when wires $A_3$ and $B_3$ of input signals A and B are asserted. Once the evaluate node voltage goes low during the evaluate phase, it cannot be driven high again until the next precharge phase.

Figure 4:
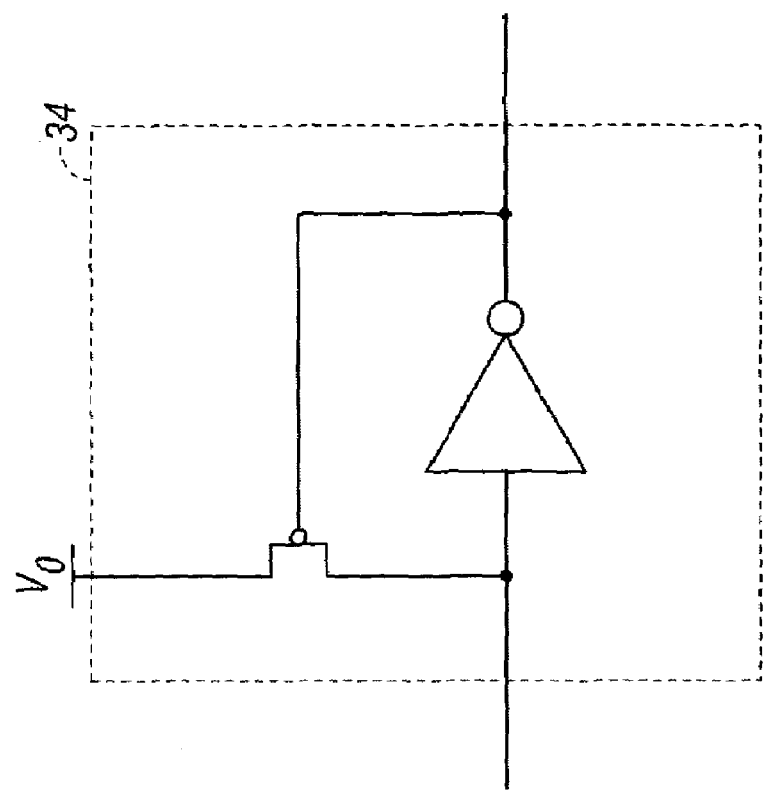
FIG. 4 is another embodiment of the inverting output driver circuit 34.
Figure 3:
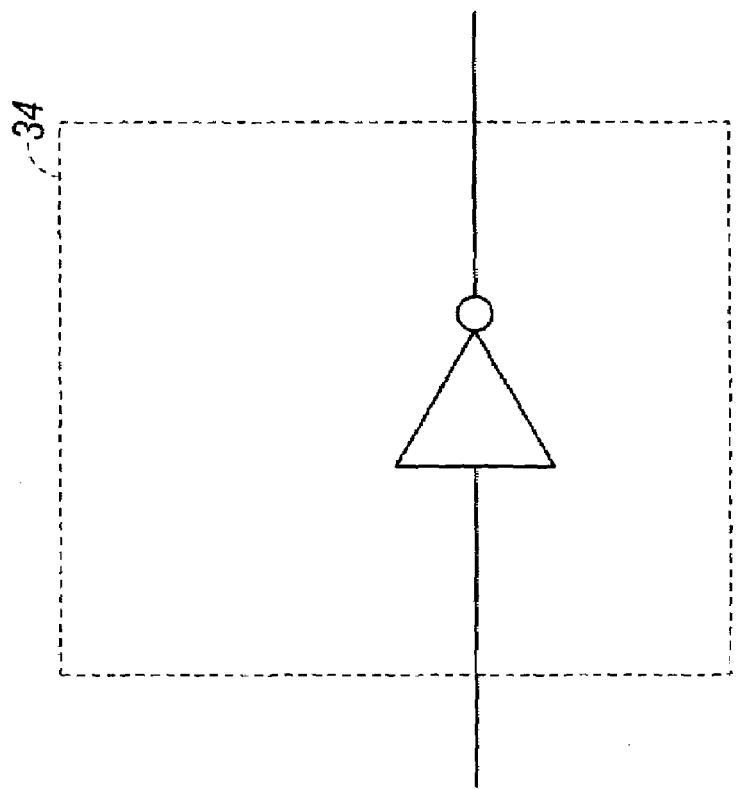
FIG. 3 is an embodiment of the inverting output driver circuit 34.

Each evaluate node $E_0$–$E_3$ is connected to an inverting output driver circuit 34 and an output wire $V_0$–$V_3$ of the 1-of-4 output signal V. Two embodiments of the inverting output driver circuit 34 are illustrated in FIGS. 3 and 4. In either case, output driver circuit 34 inverts and holds the voltage on evaluate nodes $E_0$–$E_3$ and provides the inverted voltage to the output signal wires $V_0$–$V_3$. Since, as described above, only one evaluate node will discharge each evaluate cycle, only one evaluate node will be low while all others remain at their precharge voltages. Consequently, the output driver circuits 34 will drive only one wire of the output signal V high, while the remaining wires will be driven low, thus creating a 1-of-4 output signal suitable feeding a subsequent NDL gate.

Table 2 is a truth table showing the value of the output signal V as a function of the value of the input signals A and B for the OR/NOR gate shown in FIG. 2.

TABLE 2

| Input Signal A wire asserted | | | | A dit value | Input Signal B wire asserted | | | | B dit value | Output Signal V wire asserted | | | | V dit value |
|---|---|---|---|---|---|---|---|---|---|---|---|---|---|---|
| $A_3$ | $A_2$ | $A_1$ | $A_0$ | | $B_3$ | $B_2$ | $B_1$ | $B_0$ | | $V_3$ | $V_2$ | $V_1$ | $V_0$ | |
| 0 | 0 | 0 | 1 | 00 | 0 | 0 | 0 | 1 | 00 | 0 | 0 | 0 | 1 | 00 |
| 0 | 0 | 0 | 1 | 00 | 0 | 0 | 1 | 0 | 01 | 0 | 0 | 1 | 0 | 01 |
| 0 | 0 | 0 | 1 | 00 | 0 | 1 | 0 | 0 | 10 | 0 | 1 | 0 | 0 | 10 |
| 0 | 0 | 0 | 1 | 00 | 1 | 0 | 0 | 0 | 11 | 1 | 0 | 0 | 0 | 11 |
| 0 | 0 | 1 | 0 | 01 | 0 | 0 | 0 | 1 | 00 | 0 | 0 | 1 | 0 | 01 |
| 0 | 0 | 1 | 0 | 01 | 0 | 0 | 1 | 0 | 01 | 0 | 0 | 1 | 0 | 01 |
| 0 | 0 | 1 | 0 | 01 | 0 | 1 | 0 | 0 | 10 | 1 | 0 | 0 | 0 | 11 |

TABLE 2-continued

| Input Signal A wire asserted | | | | A dit value | Input Signal B wire asserted | | | | B dit value | Output Signal V wire asserted | | | | V dit value |
|---|---|---|---|---|---|---|---|---|---|---|---|---|---|---|
| $A_3$ | $A_2$ | $A_1$ | $A_0$ | | $B_3$ | $B_2$ | $B_1$ | $B_0$ | | $V_3$ | $V_2$ | $V_1$ | $V_0$ | |
| 0 | 0 | 1 | 0 | 01 | 1 | 0 | 0 | 0 | 11 | 1 | 0 | 0 | 0 | 11 |
| 0 | 1 | 0 | 0 | 10 | 0 | 0 | 0 | 1 | 00 | 0 | 1 | 0 | 0 | 10 |
| 0 | 1 | 0 | 0 | 10 | 0 | 0 | 1 | 0 | 01 | 1 | 0 | 0 | 0 | 11 |
| 0 | 1 | 0 | 0 | 10 | 0 | 1 | 0 | 0 | 10 | 0 | 1 | 0 | 0 | 10 |
| 0 | 1 | 0 | 0 | 10 | 1 | 0 | 0 | 0 | 11 | 1 | 0 | 0 | 0 | 11 |
| 1 | 0 | 0 | 0 | 11 | 0 | 0 | 0 | 1 | 00 | 1 | 0 | 0 | 0 | 11 |
| 1 | 0 | 0 | 0 | 11 | 0 | 0 | 1 | 0 | 01 | 1 | 0 | 0 | 0 | 11 |
| 1 | 0 | 0 | 0 | 11 | 0 | 1 | 0 | 0 | 10 | 1 | 0 | 0 | 0 | 11 |
| 1 | 0 | 0 | 0 | 11 | 1 | 0 | 0 | 0 | 11 | 1 | 0 | 0 | 0 | 11 |

A shorthand notation for FAST14 circuit diagrams can be adopted to avoid needless repetition of elements common to all NDL gates. One common element is the precharge P-FETs (31 in FIG. 2). A precharge PFET 31 is required for each evaluate node E in every NDL gate. Since all NDL gates require a pre-charge P-FET 31 for each evaluate node E, the pre-charge P-FETs 31 may be implied and need not be shown. Similarly, each evaluate node E must have its own output buffer 34, which may be implied. The N-FET associated with the evaluate node 36 may also be implied. Since these features are common to all NDL gates, we may use a shorthand depiction of NDL gates that does not show the precharge PFETs 31, output buffers 34, and evaluate NFET 36. The inclusion of these elements should always be implied in NDL gate illustrations that do not show them explicitly.

Figure 5:
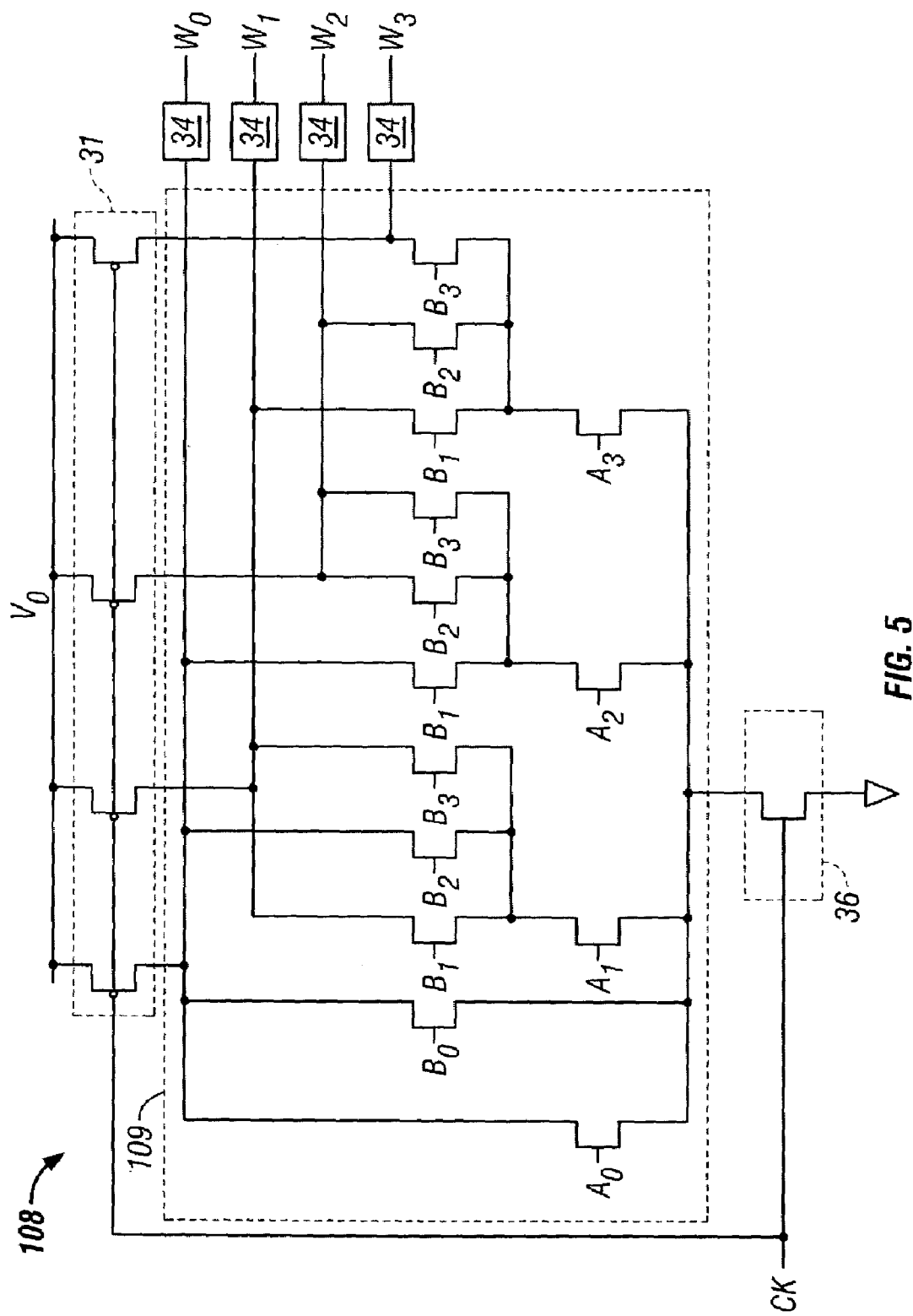
FIG. 5 is a circuit diagram of one embodiment of an NDL gate 108 that performs an AND/NAND function on two 1-of-4 input signals A and B and produces a 1-of-4 output signal W.

FIG. 5 is a circuit diagram of one embodiment of an NDL gate 108 that performs an AND/NAND function on two 1-of-4 input signals A and B and produces a 1-of-4 output signal W. Those skilled in the art will appreciate that one function is the inverse of the other. This gate periodically precharges and evaluates as described above in connection with the FIG. 2 gate. Likewise, the NFETs within shared logic tree 109 periodically either conduct or remain open during the gate's evaluation to create an evaluation path, according to which wire of input signals A and B is asserted, as described above in connection with FIG. 2. Table 3 is a truth table that describes the AND/NAND function of this gate.

TABLE 3

| Input Signal A wire asserted | | | | A dit value | Input Signal B wire asserted | | | | B dit value | Output Signal W wire asserted | | | | W dit value |
|---|---|---|---|---|---|---|---|---|---|---|---|---|---|---|
| $A_3$ | $A_2$ | $A_1$ | $A_0$ | | $B_3$ | $B_2$ | $B_1$ | $B_0$ | | $W_3$ | $W_2$ | $W_1$ | $W_0$ | |
| 0 | 0 | 0 | 1 | 00 | 0 | 0 | 0 | 1 | 00 | 0 | 0 | 0 | 1 | 00 |
| 0 | 0 | 0 | 1 | 00 | 0 | 0 | 1 | 0 | 01 | 0 | 0 | 0 | 1 | 00 |
| 0 | 0 | 0 | 1 | 00 | 0 | 1 | 0 | 0 | 10 | 0 | 0 | 0 | 1 | 00 |
| 0 | 0 | 0 | 1 | 00 | 1 | 0 | 0 | 0 | 11 | 0 | 0 | 0 | 1 | 00 |
| 0 | 0 | 1 | 0 | 01 | 0 | 0 | 0 | 1 | 00 | 0 | 0 | 0 | 1 | 00 |
| 0 | 0 | 1 | 0 | 01 | 0 | 0 | 1 | 0 | 01 | 0 | 0 | 1 | 0 | 01 |
| 0 | 0 | 1 | 0 | 01 | 0 | 1 | 0 | 0 | 10 | 0 | 0 | 0 | 1 | 00 |
| 0 | 0 | 1 | 0 | 01 | 1 | 0 | 0 | 0 | 11 | 0 | 0 | 1 | 0 | 01 |
| 0 | 1 | 0 | 0 | 10 | 0 | 0 | 0 | 1 | 00 | 0 | 0 | 0 | 1 | 00 |
| 0 | 1 | 0 | 0 | 10 | 0 | 0 | 1 | 0 | 01 | 0 | 0 | 0 | 1 | 00 |
| 0 | 1 | 0 | 0 | 10 | 0 | 1 | 0 | 0 | 10 | 0 | 1 | 0 | 0 | 10 |
| 0 | 1 | 0 | 0 | 10 | 1 | 0 | 0 | 0 | 11 | 0 | 1 | 0 | 0 | 10 |
| 1 | 0 | 0 | 0 | 11 | 0 | 0 | 0 | 1 | 00 | 0 | 0 | 0 | 1 | 00 |
| 1 | 0 | 0 | 0 | 11 | 0 | 0 | 1 | 0 | 01 | 0 | 0 | 1 | 0 | 01 |
| 1 | 0 | 0 | 0 | 11 | 0 | 1 | 0 | 0 | 10 | 0 | 1 | 0 | 0 | 10 |
| 1 | 0 | 0 | 0 | 11 | 1 | 0 | 0 | 0 | 11 | 1 | 0 | 0 | 0 | 11 |

Figure 6:
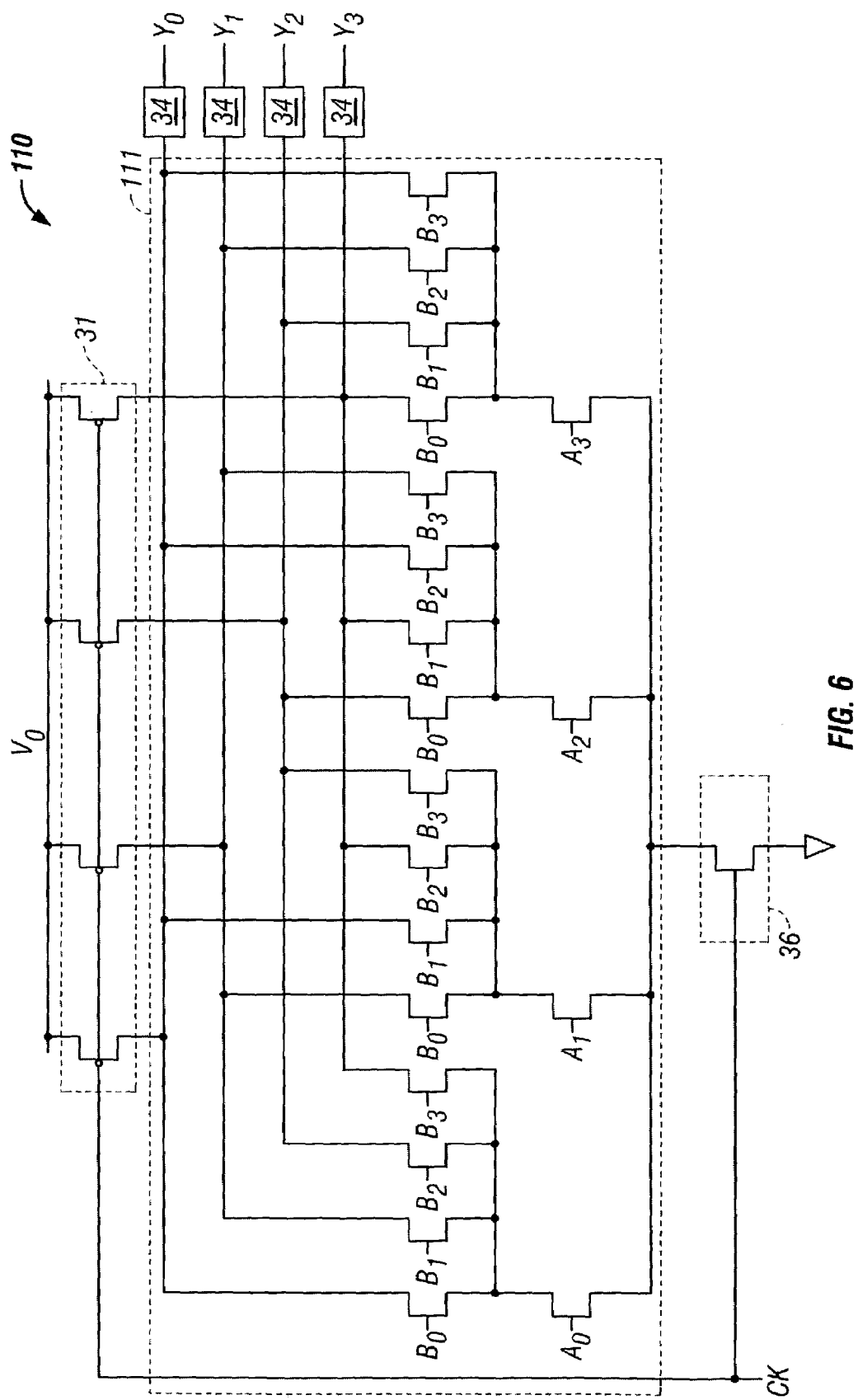
FIG. 6 is a circuit diagram of one embodiment of an NDL gate 110 that performs an XOR/Equivalence function on two 1 of-4 input signals A and B and produces a 1-of-4 output signal Y.

FIG. 6 is a circuit diagram of one embodiment of an NDL gate 110 that performs an XOR/Equivalence function on two 1-of-4 input signals A and B and produces a 1-of-4 output signal Y. Those skilled in the art will appreciate that one function is the inverse of the other. This gate periodically precharges and evaluates as described above in connection with the FIG. 2 gate. Likewise, the NFETs within shared logic tree 111 periodically either conduct or remain open during the gate's evaluation to create an evaluation path, according to which wire of input signals A and B is asserted, as described above in connection with FIG. 2. Table 4 is a truth table that describes he XOR/Equivalence function of this gate.

TABLE 4

| Input Signal A wire asserted | | | | A dit value | Input Signal B wire asserted | | | | B dit value | Output Signal Y wire asserted | | | | Y dit value |
|---|---|---|---|---|---|---|---|---|---|---|---|---|---|---|
| $A_3$ | $A_2$ | $A_1$ | $A_0$ | | $B_3$ | $B_2$ | $B_1$ | $B_0$ | | $Y_3$ | $Y_2$ | $Y_1$ | $Y_0$ | |
| 0 | 0 | 0 | 1 | 00 | 0 | 0 | 0 | 1 | 00 | 0 | 0 | 0 | 1 | 00 |
| 0 | 0 | 0 | 1 | 00 | 0 | 0 | 1 | 0 | 01 | 0 | 0 | 1 | 0 | 01 |
| 0 | 0 | 0 | 1 | 00 | 0 | 1 | 0 | 0 | 10 | 0 | 1 | 0 | 0 | 10 |
| 0 | 0 | 0 | 1 | 00 | 1 | 0 | 0 | 0 | 11 | 1 | 0 | 0 | 0 | 11 |
| 0 | 0 | 1 | 0 | 01 | 0 | 0 | 0 | 1 | 00 | 0 | 0 | 1 | 0 | 01 |
| 0 | 0 | 1 | 0 | 01 | 0 | 0 | 1 | 0 | 01 | 0 | 0 | 0 | 1 | 00 |
| 0 | 0 | 1 | 0 | 01 | 0 | 1 | 0 | 0 | 10 | 1 | 0 | 0 | 0 | 11 |
| 0 | 0 | 1 | 0 | 01 | 1 | 0 | 0 | 0 | 11 | 0 | 1 | 0 | 0 | 10 |
| 0 | 1 | 0 | 0 | 10 | 0 | 0 | 0 | 1 | 00 | 0 | 1 | 0 | 0 | 10 |
| 0 | 1 | 0 | 0 | 10 | 0 | 0 | 1 | 0 | 01 | 1 | 0 | 0 | 0 | 11 |
| 0 | 1 | 0 | 0 | 10 | 0 | 1 | 0 | 0 | 10 | 0 | 0 | 0 | 1 | 00 |
| 0 | 1 | 0 | 0 | 10 | 1 | 0 | 0 | 0 | 11 | 0 | 0 | 1 | 0 | 01 |
| 1 | 0 | 0 | 0 | 11 | 0 | 0 | 0 | 1 | 00 | 1 | 0 | 0 | 0 | 11 |
| 1 | 0 | 0 | 0 | 11 | 0 | 0 | 1 | 0 | 01 | 0 | 1 | 0 | 0 | 10 |
| 1 | 0 | 0 | 0 | 11 | 0 | 1 | 0 | 0 | 10 | 0 | 0 | 1 | 0 | 01 |
| 1 | 0 | 0 | 0 | 11 | 1 | 0 | 0 | 0 | 11 | 0 | 0 | 0 | 1 | 00 |

Figure 7:
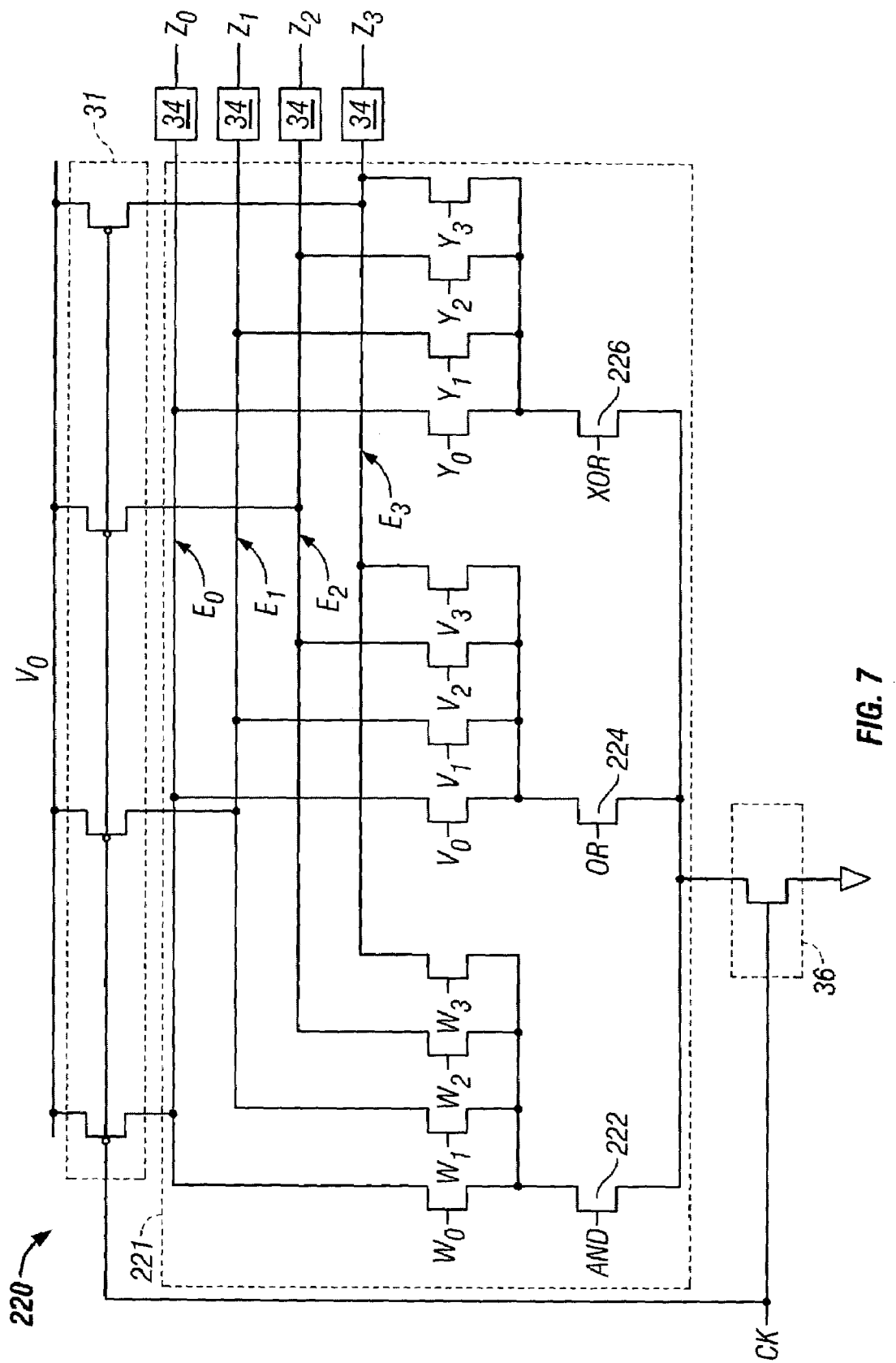
FIG. 7 is a circuit diagram of one embodiment of an NDL MUX gate 220 that selects and outputs one of three input signals.

FIG. 7 is a circuit diagram of one embodiment of an NDL MUX gate 220 that selects and outputs one of three input signals, according to the operation performed to obtain the input signal in one or more prior gates (not shown in FIG. 7). The FIG. 7 gate has four input signals, three 1-of-4 input signals W, V, and Y, and a 1-of-3 select signal having values that correspond to the functions selected (AND, OR, and XOR). The output signal is a 1-of-4 output signal Z that reflects the value of the selected input signal. This gate periodically precharges and evaluates as described above in connection with the FIG. 2 gate. Likewise, the NFETs within shared logic tree 221 periodically either conduct or remain open during the gate's evaluation to create an evaluation path, according to which wire of input signals W, V, Y is asserted, and which value of the select signal (AND, OR, or XOR) is asserted. While this embodiment of the NDL MUX gate selects and outputs an input signal as a function of the operation performed to obtain the input signal, those skilled in the art recognize that MUX gates are commonly used to select and then output one of a plurality of input signals, and the signal selection criteria is simply a matter of design choice. Accordingly, the embodiment shown in FIG. 7 is an illustrative example, and NDL MUX gates are not limited to any specific selection criteria, and the select signal input to the NDL MUX gate is not limited to any specific 1-of-N signal size.

As shown in these examples, NDL logic may be used to create circuits and circuit combinations that perform a desired function. NDL implementations of additional commonly-used logic elements (e.g., adders, shifters, multipliers, registers, and RAM devices) are described in U.S. Pat. Nos. 6,301,600; 6,269,387; 6,324,239; 6,275,841; 6,275,838, 6,104,642; and 6,118,716; all of which are incorporated by reference for all purposes into this specification.

As these examples demonstrate, every NDL logic gate precharges all evaluate nodes and discharges one evaluate node to assert a specific value on the gate's output signal. In cases when the result of one or more NDL gates is not used in the datapath, this behavior needlessly burns power.

In static logic, if a circuit is not used, and the designer is conscious of power usage, he can force the inputs to that circuit to remain constant in order to save power. Due to the continual precharge/discharge cycle of dynamic gates and the 1-hot nature of 1-of-N signals that assert a value, this technique does not work for NDL circuits without inserting structures that effectively convert 1-of-N signals to static signals for storage and/or transmission, as described in two copending patent applications, U.S. patent application Ser. No. 10/187,879, filed (2 Jul. 2002), entitled "Static Storage Element for Dynamic Logic," and U.S. patent application Ser. No. 10/186,770, filed (1 Jul. 2002), entitled "Static Transmission of FAST14 Logic 1-of-N Signals," both of which are incorporated by reference for all purposes into this specification.

The present invention is another way to save power in NDL logic designs, and can be used without requiring additional structures to be inserted into the logic. As described in further detail below, practitioners of the present invention purposely input one or more null-value 1-of-N signals to specific NDL gates, which cause the gates to remain in the precharge state (fail to discharge). Depending on the topology of the gate, if one or more of the input signals to that gate are null-value 1-of-N signals, then the output of the gate will be a null-value 1-of-N signal. In general, if a gate produces no value, the downstream gates in the datapath that are driven by the gate with a null output signal will (typically) also not assert a value. (There are some exceptions to this rule, described further below). Thus, practitioners of the present invention can prevent a single gate from asserting a value, thereby causing some number of down stream gates also to not assert a value, effectively propagating a null value signal through the datapath. As shown below, this technique can be used to save power in unused logic areas without affecting the timing or performance of the design.

For the purposes of this discussion, we divide NDL gates into 2 classes: MUX-like functions which use one or more control signals to select one of one or more data inputs to send to the output data (e.g., the gate shown in FIG. 7), and arithmetic functions which take one or more data inputs and combine them to produce a single output (e.g., the gates shown in FIGS. 2, 5, 6, and 10, and some of the gates shown and described in U.S. Pat. Nos. 6,301,600; 6,269,387; 6,324, 239; 6,275,841; 6,275,838, 6,104,642; and 6,118,716). In general, gates performing a MUX-like function will output a null value when the 1-of-N signal that selects the gate's output is a null signal, while gates that perform an arithmetic function will generally output a null value signal when any of the gate's inputs are null signals.

Returning to FIG. 7, we see that if the select signal (the signal having values of AND, OR, or XOR) is a null signal, then no wire of that signal is asserted, and none of transistors 222, 224, and 226 conduct when the gate evaluates. Consequently, regardless of which wire, if any, of input signals W, V, and Y is asserted, none of the evaluation nodes $E_0$–$E_3$ will discharge but instead, will remain high after being precharged. Output buffers 34 invert the high voltage on $E_0$–$E_3$, forcing all wires of the output signal Z low, thus creating a null value output signal for this gate.

On the other hand, if the select signal is not a null value (i.e., either the AND wire, the OR wire, or the XOR wire of the input select signal is asserted), then one of transistors 222, 224, or 226 will conduct during the gate's evaluation phase. If the input data signal associated with the function asserted by the select signal is not a null value but rather, has a wire asserted, then an evaluation path will be completed and one of the evaluation nodes will discharge, causing one of output wires $Z_0$–$Z_3$ to be asserted. In this case, output signal Z will not be a null value. Consequently, in NDL gates that perform a MUX-like function, if the select signal input is a null signal, then the output is a null signal, regardless of the value of the other inputs to the gate. If the select signal is not a null value signal, then the output will not be a null value signal if the selected input signal is not a null value signal.

Returning to FIG. 6, an arithmetic gate, we see that due to this gate's topology, if any input is a null value signal, then the output will be a null value signal. No evaluation path will be completed if no wire of input signal A is asserted, regardless of whether any of the wires of input signal B is asserted. Likewise, even if a wire of input signal A is asserted, if no wire of input signal B is asserted, then no evaluation path will be completed. In this gate, any null value signal input will cause the gate output to be a null value signal. Those skilled in the art will recognize that this general rule is also true for the typical simple adder arithmetic gate shown in FIG. 10.

This general rule for arithmetic gates is not true for the simple gates shown in FIGS. 2 and 5, due to these gates' specific topology. In the OR/NOR gate shown in FIG. 2, input signal A may be a null signal but if input signal B has a decimal value of 3 (dit value 11), then wire $B_3$ will be asserted and transistor 76 will conduct when the gate evaluates. This will complete an evaluation path and evaluation node $E_3$ will discharge, causing output signal V to assert a decimal value of 3, even though input signal A was a null signal. This is also true if input signal B is a null signal but input signal A has a decimal value of 3. The same thing occurs in the OR/XOR gate shown in FIG. 5—when either one of input signals A or B has a value of 0, even if the other input signal is null, the gate will also assert an output value of 0. To the extent that practitioners of the present invention require that an OR/NOR gate or an OR/XOR gate such as the gates shown in FIGS. 2 and 5 propagate a null value signal when any input is null, rather than when a selected input is null, those skilled in the art will understand that these gates easily can be modified to achieve that objective without altering the function of the gate during normal 1-hot operation by inserting additional appropriately-gated NFETs above transistors 62 and 76 in FIG. 2 and above the $A_0$ and $B_0$ transistors in FIG. 5.

Figure 8:
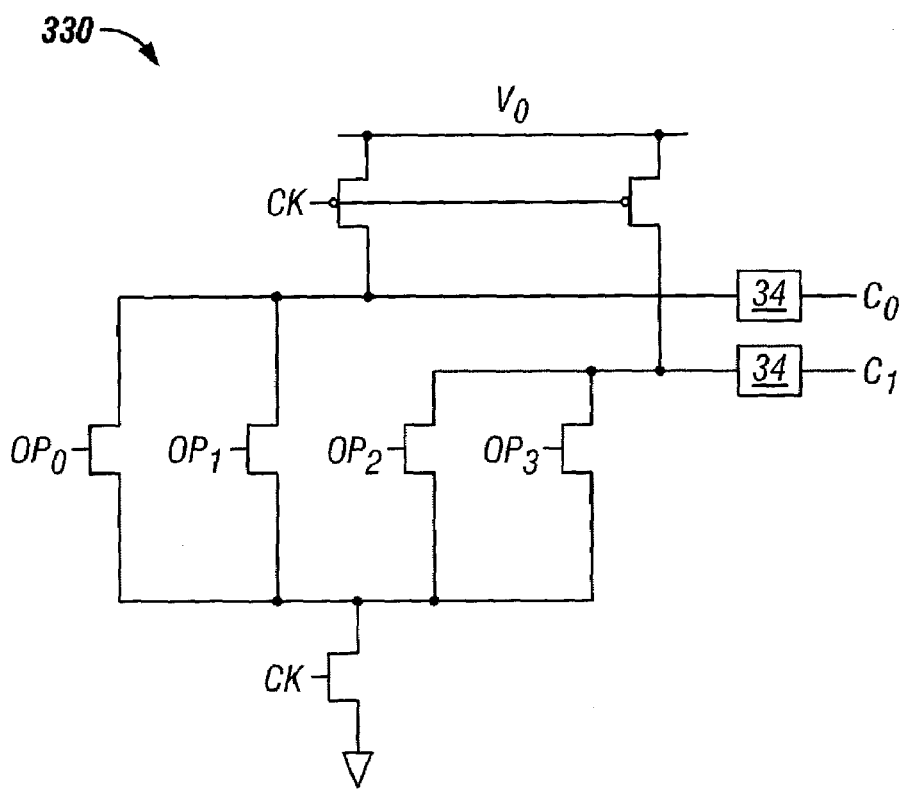
FIG. 8 is a decoder circuit such as might be used to generate controls for an execution unit that is producing results for two operations.

FIG. 8 is a decoder circuit such as might be used to generate controls for an execution unit that is producing results for two operations. Suppose that the decoder 330 is looking at a 2-bit opcode that decodes into operations 0–3. The input signal to this decoder is a 1 of-4 signal OP, having wires $OP_0$–$OP_3$, as shown in FIG. 8. However, in this case, suppose that the execution unit that this decoder feeds is producing results only for operations 1 and 2. Consequently, when the opcode corresponds to operation 0 or operation 3, the result of the execution unit that the FIG. 8 decoder feeds is a "don't care" value that is not used.

The FIG. 8 decoder will never produce a null value if the opcode signal input OP is not null. In fact, those skilled in the art will understand that this decoder will cause the execution unit to operate, but to produce bogus values for operations 0 and 3. Operating the unit to produce bogus results that are not used causes an unnecessary consumption of power that the present invention can be used to avoid.

Figure 9:
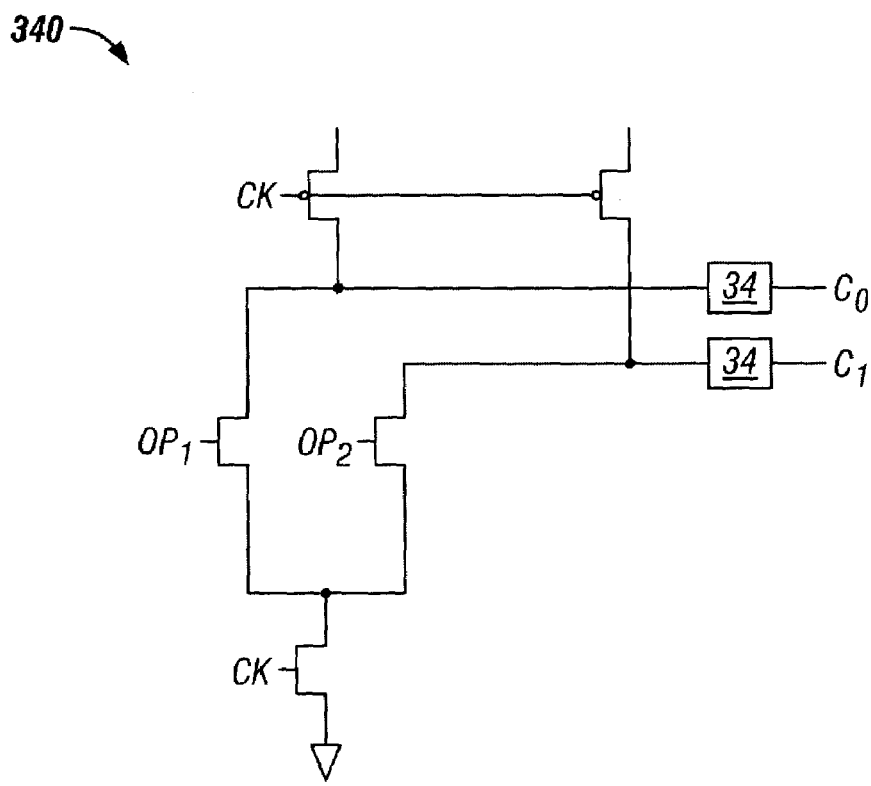
FIG. 9 is another embodiment of a decoder circuit such as might be used to generate controls for an execution unit that is producing results for two operations that propagates a null value to the execution unit for nonselected operations.
Figure 10:
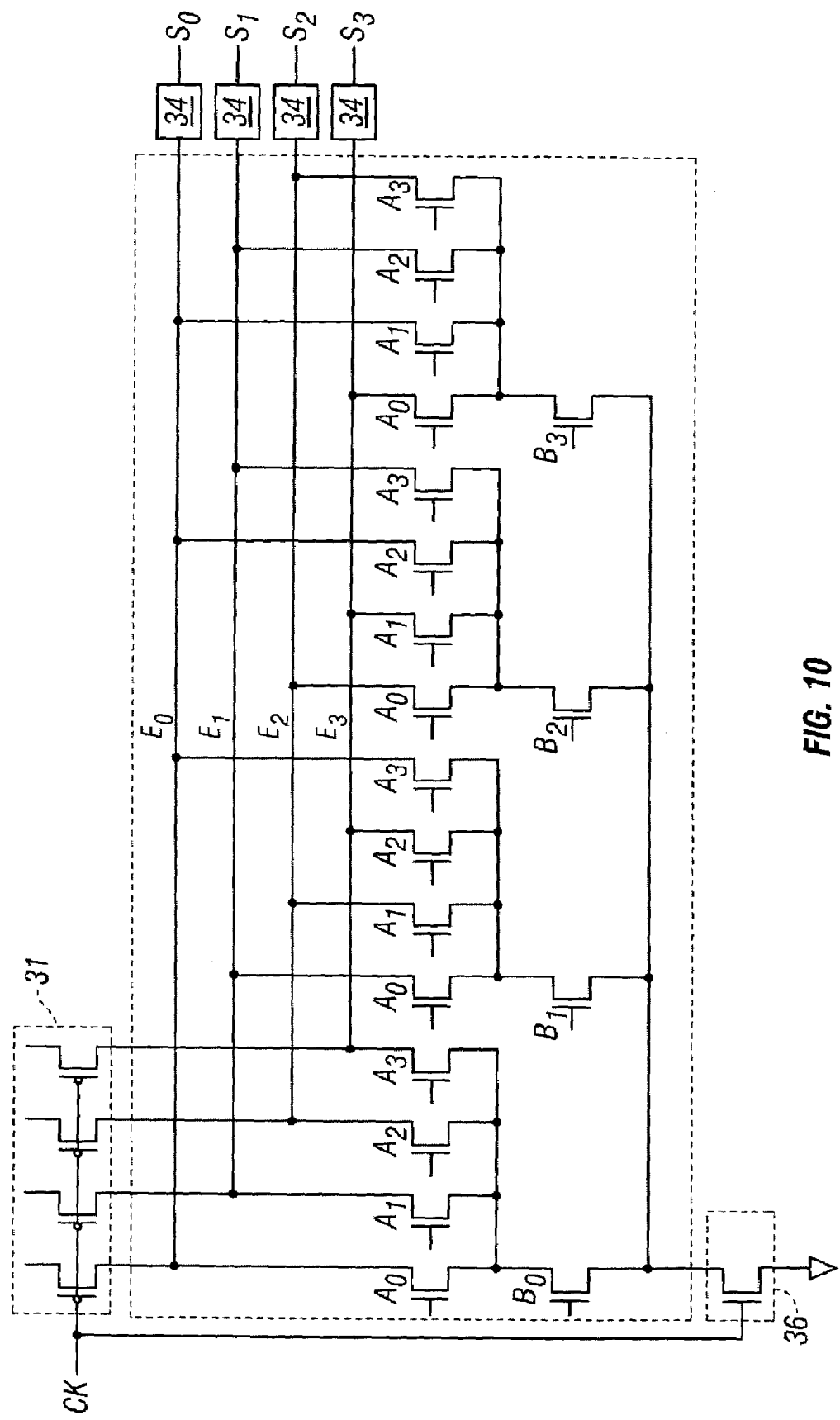
FIG. 10 is a typical simple adder arithmetic NDL gate that will output a null value signal if any input is a null value signal.
Figure 11:
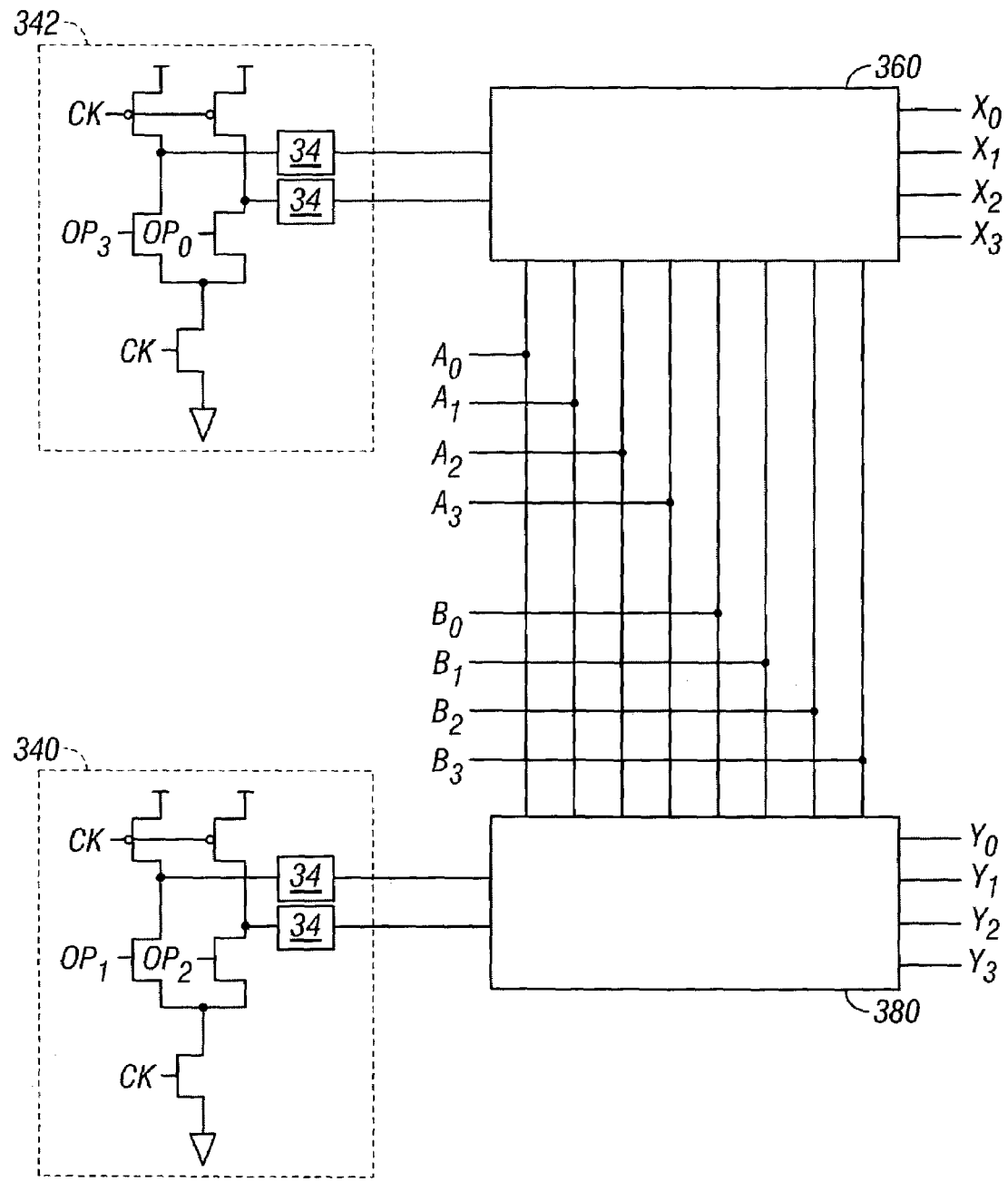
FIG. 11 shows the use of decoders capable of generating null value signals to minimize power consumption in unused execution units.
Figure 12:
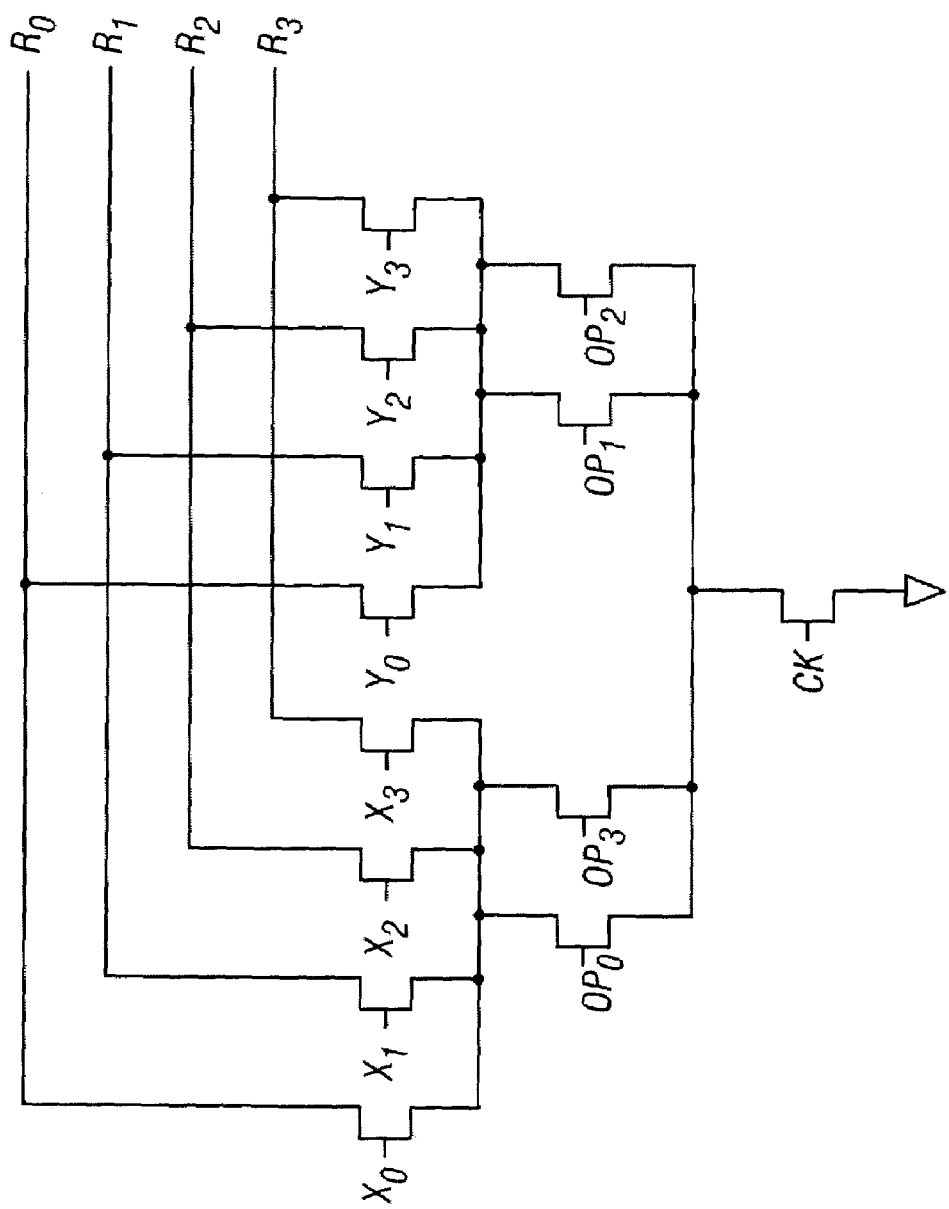
FIG. 12 shows the use of a multiplexer in the datapath to terminate the propagation of a null value signal purposefully introduced to minimize power consumption.

To illustrate, suppose that the FIG. 9 decoder 340 is feeding the execution unit that is producing results for opcodes 1 and 2 as described above, instead of decoder 330. This scenario is illustrated in FIG. 11. In FIG. 11, decoder 340 controls execution unit 380, which receives inputs A and B and produces result Y. Similarly, decoder 342 controls execution unit 360, which receives inputs A and B and produces result X. In this case, when wire $OP_1$ or $OP_2$ of the OP signal is asserted, the decoder 340 generates the proper control signal for the execution unit 380, which will provide the correct result Y for the selected operation. However, decoder 342 will generate a null value, which is an input to execution unit 360 and causes the execution unit 360's output signal X to be a null value. When operation 0 or operation 3 is selected, (i.e., either wire $OP_0$ or wire $OP_3$ of the input signal OP is asserted), the decoder 342 generates the proper control signal for the execution unit 360, which will provide the correct result X for the selected operation, while decoder 340 generates a null value as an input to execution unit 380, creating a null value output signal Y. As this example illustrates, this approach inhibits the execution units from operating and producing bogus values when "their" opcode is not selected, thus preventing the unnecessary expenditure of power to generate values that will not be used. FIG. 12 shows a multiplexer inserted at the end of the FIG. 11 datapath that uses the opcode to select the proper result from the proper execution unit. Practitioners of the present invention will recognize that as long as there is an opcode asserted, the FIG. 12 multiplexer will never select a result from an execution unit that is propagating a null value, effectively terminating the propagation of the null value signal in this portion of the logic.

Note that the size of the null-generating control gate 340 and 342 shown in FIGS. 9 and 11 is smaller than the size of the decoder 300 shown in FIG. 8, which does not generate a null value signal. Practitioners of the present invention will find that this is often the case when designing logic cells capable of generating a null value output signal, as transistors that decode the "don't-care" plane can often simply be omitted.

This example illustrates some important features of the present invention. No additional control signals were required to accomplish the power savings achieved by generating the null value control signal and propagating it through the execution unit. In addition, the power savings 'control' was accomplished through the natural data and control paths using existing functional logic circuits rather than structures dedicated solely to power management. This means that for a pipelined design, a null value can be inserted into the top of the pipeline, and it will flow through the pipeline naturally, allowing normal operations to occur on either side of it in the pipe. With other methods for power savings, like clock gating, it can be difficult to attain this granularity, because a single clock may control a large set of gates. In addition, the present invention does not require the insertion of additional circuits and structures dedicated solely to power management, unlike other power management methods such as the use of static storage techniques and static data transmission as described above.

Those skilled in the art will understand, after reading the specification and/or practicing the present invention, that practitioners can introduce and propagate null value signals using a mode control approach. For example, selected input signals to arithmetic gates that follow the general rule described above can be forced to a null when power reduction features are to be enabled, and assert a "don't care" value when power reduction features are not enabled.

In sum, the present invention comprises a method and apparatus that uses an NDL logic gate to propagate a null value 1-of-N signal to reduce power consumption in certain areas of FAST14-based logic. The present invention includes a 1-of-N input logic signal and a shared logic tree circuit that evaluates the 1-of-N input logic signal and produces a 1-of-N output logic signal that is a null value signal if the 1-of-N input logic signal is a null value signal. A null value signal is defined as a 1-of-N signal, which is a multiwire signal used in NDL logic that has N wires where N is greater than 2, where no one of the N wires of the 1-of-N signal is asserted when the NDL logic gate evaluates. The shared logic tree circuit may be a circuit that performs an arithmetic function that manipulates the input 1-of-N logic signal or combines the 1-of-N input logic signal with another input signal to produce an output signal, such as an adder or a Boolean logic function, or it may perform a multiplexing function that selects one or more 1-of-N input logic signals to produce the 1-of-N output logic signal. In either case, practitioners of the present invention force the 1-of-N output logic signal to be a null value signal by forcing the 1-of-N input logic signal to be a null value signal while the logic tree evaluates. If the 1-of-N output logic signal comprises an input signal to another NDL gate, then the null value signal will also propagate through that gate. Those skilled in the art will understand that practitioners of the present invention can arrange their logic designs to support propagation of null value signals through multiple gates along a datapath, and can halt the propagation of the null value signal by using a multiplexer in the datapath that never selects a null value input. Other embodiments of the invention will be apparent to those skilled in the art after considering this specification or practicing the disclosed invention. The specification and examples above are exemplary only, with the true scope of the invention being indicated by the following claims.

We claim:

1. A NDL logic gate that propagates a null value, comprising:
   a 1-of-N input logic signal having N input wires where N is greater than 2; and
   a shared logic tree circuit having an evaluate state and a precharge state, said shared logic tree circuit evaluates said 1-of-N input logic signal and produces a 1-of-N output logic signal having N output wires where N is greater than 2;
   wherein said 1-of-N output logic signal further comprises a null value signal having none of said N output wires asserted after said evaluate state if said 1-of-N input logic signal comprises a null value signal having none of said N input wires asserted during said evaluate state.

2. A method that makes an NDL logic gate that propagates a null value, comprising:
   providing a 1-of-N input logic signal having N input wires where N is greater than 2; and
   coupling a shared logic tree circuit having an evaluate state and a precharge state to said 1-of-N input logic signal, said shared logic tree circuit evaluates said 1-of-N input logic signal and produces a 1-of-N output logic signal having N output wires where N is greater than 2;
   wherein said 1-of-N output logic signal further comprises a null value signal having none of said N output wires asserted after said evaluate state if said 1-of-N input logic signal comprises a null value signal having none of said N input wires asserted during said evaluate state.

3. A method that uses an NDL logic gate that propagates a null value, comprising:
   receiving a 1-of N input logic signal having N input wires where N is greater than 2; and
   producing a 1-of-N output logic signal having N output wires where N is greater than 2 by evaluating said 1-of-N input logic signal using a shared logic tree circuit having an evaluate state and a precharge state;
   wherein said 1-of-N output logic signal further comprises a null value signal having none of said N output wires asserted after said evaluate state if said 1-of-N input logic signal comprises a null value signal having none of said N input wires asserted during said evaluate state.

4. A dependent claim according to claim 1, 2, or 3 wherein said shared logic tree circuit further comprises a circuit that performs an arithmetic function that either combines one or more data inputs to produce an output or manipulates one or more data inputs to produce an output.

5. A dependent claim according to claim 1, 2, or 3 wherein said shared logic tree circuit further comprises a multiplexer circuit that selects one or more data inputs to produce an output.

6. An NDL logic gate that propagates a null value, comprising:
   a 1-of-N input logic signal having N input wires where N is greater than 2; and
   a shared logic tree circuit having an evaluate state and a precharge state that receives said 1-of-N input logic signal and produces a 1-of-N output logic signal having N output wires where N is greater than 2, said shared logic tree circuit further consists of one of the following: a logic circuit that performs an arithmetic function that either combines one or more data inputs or manipulates one or more data inputs to produce said 1-of-N output logic signal, or a multiplexer circuit that selects one or more data inputs to produce said 1-of-N output logic signal;
   wherein said 1-of-N output logic signal further comprises a first null value signal having none of said N output wires asserted after said evaluate state if said 1-of-N input logic signal comprises a second null value signal having none of said N input wires asserted during said evaluate state.

7. A method that makes an NDL logic gate that propagates a null value, comprising:
   providing a 1-of-N input logic signal having N input wires where N is greater than 2; and
   coupling a shared logic tree circuit having an evaluate state and a precharge state to said 1-of-N input logic signal, said shared logic tree circuit produces a 1-of-N output logic signal having N output wires where N is greater than 2, said shared logic tree circuit further consists of one of the following: a logic circuit that performs an arithmetic function that either combines one or more data inputs or manipulates one or more data inputs to produce said 1-of-N output logic signal, or a multiplexer circuit that selects one or more data inputs to produce said 1-of-N output logic signal;

wherein said 1-of-N output logic signal further comprises a first null value signal having none of said N output wires asserted after said evaluate state if said 1-of-N input logic signal comprises a second null value signal having none of said N input wires asserted during said evaluate state.

8. A method that uses an NDL logic gate that propagates a null value, comprising:

receiving a 1-of-N input logic signal having N input wires where N is greater than 2; and producing a 1-of-N output logic signal having N output wires where N is greater than 2 using a shared logic tree circuit having an evaluate state and a precharge state that receives said 1-of-N input logic signal, said shared logic tree circuit further consists of one of the following: a logic circuit that performs an arithmetic function that either combines one or more data inputs or manipulates one or more data inputs to produce said 1-of-N output logic signal, or a multiplexer circuit that selects one or more data inputs to produce said 1-of-N output logic signal;

wherein said 1-of-N output logic signal further comprises a first null value signal having none of said N output wires asserted after said evaluate state if said 1-of-N input logic signal comprises a second null value signal having none of said N input wires asserted during said evaluate state.

* * * * *

UNITED STATES PATENT AND TRADEMARK OFFICE
CERTIFICATE OF CORRECTION

| | | |
|---|---|---|
| PATENT NO. | : 7,053,664 B2 | Page 1 of 1 |
| APPLICATION NO. | : 10/300289 | |
| DATED | : May 30, 2006 | |
| INVENTOR(S) | : Terence M. Potter et al. | |

It is certified that error appears in the above-identified patent and that said Letters Patent is hereby corrected as shown below:

In column 1, line 34, delete "bgic" and insert -- logic --, therefor.

In column 2, line 12, delete "bgic" and insert -- logic --, therefor.

In column 3, line 58, delete "1 of-4" and insert -- 1-of-4 --, therefor.

In column 7, line 26, delete "N-FET" and insert -- NFET --, therefor.

In column 8, line 66, delete "he" and insert -- the --, therefor.

In column 11, line 67, delete "1 of-4" and insert -- 1-of-4 --, therefor.

In column 13, line 61, in Claim 1, delete "a null" and insert -- a first null --, therefor.

In column 13, line 63, in Claim 1, delete "a null" and insert -- a second null --, therefor.

In column 14, line 10, in Claim 2, delete "a null" and insert -- a first null --, therefor.

In column 14, line 12, in Claim 2, delete "a null" and insert -- a second null --, therefor.

In column 14, line 17, in Claim 3, delete "1-of N" and insert -- 1-of-N --, therefor.

In column 14, line 24, in Claim 3, delete "a null" and insert -- a first null --, therefor.

In column 14, line 26, in Claim 3, delete "a null" and insert -- a second null --, therefor.

Signed and Sealed this
Twentieth Day of December, 2011

David J. Kappos
*Director of the United States Patent and Trademark Office*